United States Patent [19]

Sugioka

[11] Patent Number: 4,516,527
[45] Date of Patent: May 14, 1985

[54] PHOTOCHEMICAL VAPOR DEPOSITION APPARATUS

[75] Inventor: Shinji Sugioka, Kawasaki, Japan

[73] Assignee: Ushio Denki Kabushiki Kaisha, Tokyo, Japan

[21] Appl. No.: 566,791

[22] Filed: Dec. 29, 1983

[30] Foreign Application Priority Data

Feb. 1, 1983 [JP] Japan ............................. 58-13761

[51] Int. Cl.³ .............................................. C23C 13/12
[52] U.S. Cl. .................................... 118/723; 118/726; 118/724; 118/50.1; 118/667; 427/54.1; 427/38; 422/186.3
[58] Field of Search .................... 427/54.1, 38, 39, 40, 427/41; 118/723, 50.1, 726, 666, 667, 724, 727, 620, 722; 422/186.04, 186.05, 186.3

[56] References Cited

U.S. PATENT DOCUMENTS 3,310,424 3/1967 Wehner et al. ................. 118/724 X
3,619,283 11/1971 Carpenter ....................... 118/726 X
3,971,968 7/1976 Bachmann et al. .................. 315/108
4,265,932 5/1981 Peters et al. .................... 118/620 X
4,454,835 6/1984 Walsh et al. .................... 118/723 X Primary Examiner—John D. Smith
Assistant Examiner—Bernard F. Plantz
Attorney, Agent, or Firm—Ziems, Walter & Shannon

[57] ABSTRACT

In a photochemical vapor deposition apparatus, a reaction space forming a passage for a photoreactive gas, in which reaction space a substrate is to be placed, and a discharge space, in which electric plasma discharge is generated for radiating ultraviolet rays which cause photochemical reaction of the photoreactive gas, are surrounded by the same vessel. A mercury reservoir that communicates with the discharge space by way of a communication pipe is provided outside the vessel, the communication pipe is heated at a temperature higher than that of the mercury reservoir by a heater, and the mercury reservoir is controlled in temperature by a Peltier effect element which may be cooled with a water-cooled block provided on one side thereof.

This photochemical vapor deposition apparatus can achieve photochemical vapor deposition with high efficiency, because the control of the vapor pressure of mercury for discharge is carried out easily and ultraviolet rays can be radiated with high efficiency.

3 Claims, 2 Drawing Figures

PHOTOCHEMICAL VAPOR DEPOSITION APPARATUS

BACKGROUND OF THE INVENTION

1. Field of the Invention

This invention relates to a photochemical vapor deposition apparatus.

2. Description of the Prior Art

Recently, there have been studied methods for forming a vapor-deposited film of amorphous silicon for use in the photosensitive drum of a duplicating machine or a solar cell. On the other hand, a vapor depositing method is further utilized in the formation of diverse insulating films or protective films, and a variety of vapor depositing methods have been proposed in answer to various uses. Among these methods, a photochemical vapor depositing method utilizing a photochemical reaction is being now particularly watched because of having such advantages as the film-forming rate is remarkably high and a uniform film can be formed on a portion of large area of a substrate, too.

A conventional chemical vapor depositing method utilizing a photochemical reaction comprises placing a substrate in an air-tight vessel made of material through which ultraviolet rays can be fully transmitted, feeding a photoreactive gas to flow through the vessel and applying ultraviolet rays radiated from an ultraviolet discharge lamp outside of the vessel through the wall thereof onto the substrate so that a photochemical reaction is caused to decompose the photoreactive gas and the resulting reaction product is vapor-deposited onto the substrate. In spite of having the above-mentioned remarkable advantages, this conventional photochemical deposition method which may be called an "outer discharge type", has however been found to have the defect that the reaction product is also vapor-deposited on the inner wall of the vessel, seriously impeding the transmission of ultraviolet rays.

Thus, a photochemical vapor deposition apparatus, which may be called an "inner discharge type", has been studied and developed. In the apparatus of this type, a reaction space and a discharge space are surrounded by the same vessel in an air-tight manner. The reaction space forms a passage for a photoreactive gas and in this reaction space a substrate is to be placed. In the discharge space, electric plasma discharge is generated and ultraviolet rays radiated from the plasma are directed onto the substrate to cause a photochemical reaction of decomposition of the photoreactive gas. Between the plasma and the substrate, there is no partition member that impedes the passing of the ultraviolet rays.

In such apparatus, in general, it is important to control properly the vapor pressure of mercury, which is a gas for electric discharge, in order that ultraviolet rays are generated with high efficiency from the plasma. In a case of the above-mentioned apparatus in which ultraviolet rays are applied from the outside of a vessel by an ultraviolet discharge lamp, it is feasible to control the vapor pressure of mercury relatively easily by regulating the temperature of the coolest portion of the lamp tube wall. On the contrary, in the case of the inner discharge type of vapor deposition apparatus, there are very difficult problems in controlling the vapor pressure of mercury. The reasons for the problems will be described here. In order to supply mercury vapor into the discharge space of the inner discharge type apparatus, such a method is carried out such that a mercury reservoir is provided and communicated on the way of a supply pipe for the photoreactive gas, for example, and mercury vapor is introduced into the vessel together with the flowing photoreactive gas. In this method, however, the vapor pressure of mercury in the discharge space of the vessel occasionally falls far out of its optimum value because mercury is condensed and deposited on the low temperature part of the inner wall of the pipe forming a passage therefor even though the mercury reservoir is controlled as to temperature. In addition, another method is also carried out in which a mercury reservoir is provided on the bottom of a reaction vessel so that mercury is caused to vaporize in a discharge space directly. In this method, it is required to provide a space for the mercury reservoir in the reaction vessel, and furthermore the mercury reservoir must be arranged in such a manner that it does not obstruct the application of ultraviolet rays. Also in this method, in fact, it is difficult to regulate the temperature of the mercury reservoir to a temperature different from that of the vessel and to control the vapor pressure of mercury in the discharge space.

SUMMARY OF THE INVENTION

With the foregoing in view, an object of this invention is to provide a photochemical vapor deposition apparatus of an inner discharge type in which the control of the vapor pressure of mercury for discharge is carried out easily and ultraviolet rays can be radiated with high efficiency.

In accordance with this invention, there is provided an inner discharge type of photochemical vapor deposition apparatus wherein a reaction space forming a passage for a photoreactive gas, in which reaction space a substrate is to be placed, and a discharge space, in which electric plasma discharge is generated for radiating ultraviolet rays which cause photochemical reaction of the photoreactive gas, are surrounded by the same vessel. A mercury reservoir that communicates with the discharge space by way of a communication pipe is provided outside the vessel, the communication pipe is heated at a temperature higher than that of said mercury reservoir by a heater, and the mercury reservoir is controlled in temperature by a Peltier effect element.

The inner discharge type of photochemical vapor deposition apparatus according to the invention can achieve the photochemical vapor deposition with high efficiency for the following reasons.

Since the mercury reservoir is provided outside the vessel, the inner space of tne vessel can be effectively utilized and the mercury reservoir never obstructs the application of ultraviolet rays to a substrate, and furthermore the temperature control of mercury and the vapor thereof in the mercury reservoir can be easily carried out. Since the temperature control of the mercury reservoir is carried out by using a Peltier effect element, it becomes possible to control the mercury temperature precisely and therefore ultraviolet rays of the maximum output power can always be obtained. Furthermore, since the communication pipe is maintained at a temperature higher than the temperature of the mercury reservoir, mercury is not condensed and deposited thereon. As it is, thus, easy to control the vapor pressure of mercury in the discharge space, it is possible to generate ultraviolet rays with high efficiency, whereby the photochemical vapor deposition can be achieved with high efficiency.

The principle and construction of this invention will be clearly understood from the following detailed description and appended claims, taken in conjunction with the accompanying drawing.

DETAILED DESCRIPTION OF THE INVENTION AND PREFERRED EMBODIMENT

This invention will be concretely described with reference to the preferred embodiment illustrated in the accompanying drawing.

Figure 1:
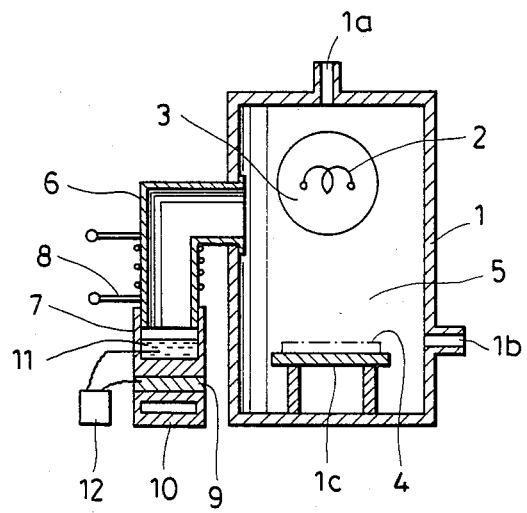
FIG. 1 is a cross-sectional view showing an embodiment of the inner discharge type of photochemical vapor deposition apparatus according to this invention.
Figure 2:
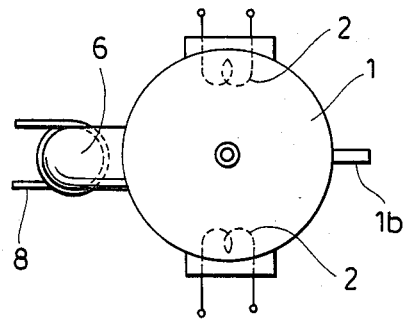
FIG. 2 is a top plan view of the photochemical vapor deposition apparatus shown in FIG. 1.

In FIG. 1 and FIG. 2, a pair of electrodes 2, 2 are arranged opposite to each other in the upper part of an air-tight vessel 1, and the space between the electrodes 2, 2 constitutes a discharge space 3. A gas supply port 1a and a gas exhaust port 1b for a photoreactive gas are provided on the top part and the lower part of said vessel 1, respectively. A sample table 1c is mounted on the bottom part of the vessel 1 and the space above said sample table 1c constitutes a reaction space 5. No partition such as a transparent quartz glass plate is provided between the discharge space 3 and the reaction space 5. A communication pipe 6 composed of a transparent quartz glass pipe is connected with the side wall so as to communicate with the discharge space 3 of the vessel 1, and a mercury reservoir 7 made of metal is provided at the lower end of the communication pipe 6. Accordingly, when mercury in this mercury reservoir 7 has been evaporated and fed as a gas for electric discharge into the discharge space 3 of the vessel 1 the inside of which is kept at reduced pressure, and when electric plasma discharge is generated, ultraviolet rays are radiated from the plasma. The communication pipe 6 can be heated by an electric heater 8 consisting of resistive wire wound thereon, and a temperature control means 9 is provided in contact on the back side of the mercury reservoir 7. This temperature control means 9 is of a Peltier effect element closely contacted with the reverse side of a metal plate which is excellent in thermal conduction, such as aluminum or copper, while one side of the metal plate is in contact with the outer surface of the mercury reservoir 7. A Peltier effect element functions such that, when an electric current is fed in one direction to the element, an endothermic phenomenon occurs on one side thereof and an exothermic phenomenon on the other side in response to its amperage, and when the electric current is fed in the reverse direction, the endothermic side and exothermic side are reversed. This Peltier effect element is small in thermal inertia, and it is possible to effect the temperature control of said element precisely with little power consumption. If, preferably, a rubber sheet having high thermal conduction is attached or a paste material of high thermal conduction is applied on the surface of the metal plate, the close contact between the metal plate and the outer surface of the mercury reservoir 7 will be improved, but the Peltier effect element may be in direct contact with the outer surface of the mercury reservoir 7, because said metal plate is not required. On the back side of the temperature control means 9, a water-cooled block 10 is provided in contact therewith so as to cool the back side of the temperature control means 9. Although the water-cooled block 10 is not required always, the Peltier effect element can be worked effectively by cooling the exothermic side thereof with a cooling member such as the water-cooled block 10. A thermometer 11 is mounted in the mercury reservoir 7 to detect the temperature of mercury. The Peltier effect element is adapted to be supplied with an electric current which has a direction and an intensity corresponding to the difference between the actually detected temperature of mercury and the set temperature which is the control target by a control box 12 to which a signal of the actually detected temperature is fed. After the vapor deposition apparatus has begun to work and has reached a stationary state, the mercury reservoir 7 is controlled so as to be heated by the temperature control means 9 when the mercury temperature is lower than the set temperature, or to be cooled when it is higher. Thus, the temperature of mercury in the mercury reservoir 7 is always maintained at the set temperature. The communication pipe 6 is maintained at a temperature higher than the set temperature by being heated with the electric heater 8.

An example of the vapor deposition carried out by use of the above-mentioned apparatus will be described. A photochemically reactive gas which was a mixed gas consisting of argon of 5 mmHg as a carrier gas, mercury vapor of $3 \times 10^{-3}$ mmHg as a photosensitizer and silane gas of +0.3 mmHg as a gas for vapor deposition was fed to flow through the reaction space 5, and the set temperature of mercury in the mercury reservoir 7 was regulated at 70° C. so that the vapor pressure of mercury reached $2 \times 10^{-3}$ mmHg in the discharge space 3. Under such a condition, the communication pipe 6 had been heated at 150° C. and the mercury vapor never condensed and deposited inside thereof. The substrate 4 to be processed was an alumina plate heated to about 150° C. When electric discharge was generated at a voltage of 60 V and an amperage of 5 A in the discharge space 3, ultraviolet rays radiated from the plasma were directed onto the substrate and the silane gas was decomposed, whereby amorphous silicon was vapor-deposited on the substrate 4. Throughout the period of operation described above, since the vapor pressure of mercury in the discharge space 3 had been controlled at an optimum value, ultraviolet rays were stably radiated with high efficiency from the plasma of the discharge generated in the discharge space 3. The variation in the output of the spectrum light of wave-lengh of 254 nm fell within 2%, and the power consumption of the Peltier effect element was as low as 5 W.

In the apparatus according to the present invention, it is preferable to provide an additional heater on the outer periphery of the vessel. The additional heater may comprise an electric heater as the heater 8. Operation of the additional heater prevents mercury vapor in the vessel 1 from being condensed and deposited on the inner surface of the vessel 1.

Having now fully described the invention, it will be understood for those skilled in the art that various changes and modifications can be made thereto without departing from the spirit or scope of the invention as set forth herein.

What is claimed is:

1. A photochemical vapor deposition apparatus comprising:

means, including a vessel, for defining a reaction space in which the photochemical vapor deposition occurs and a discharge space in which electric plasma discharge is generated, said reaction space forming a passage for a photoreactive gas, and said electric plasma being generated for radiating ultraviolet rays which cause a photochemical reaction of said photoreactive gas;

a mercury reservoir outside said vessel and in communication with the discharge space by way of a communication pipe;

means heating said communication pipe to a temperature higher than the temperature of the mercury reservoir; and means, including a Peltier effect element, for controlling the temperature of the mercury reservoir.

2. A photochemical vapor deposition apparatus as set forth in claim 1, in which a water-cooled block is provided in contact with one side of the Peltier effect element for cooling thereof.

3. A photochemical vapor deposition apparatus comprising:

means, including a vessel, for defining a reaction space in which the photochemical vapor deposition occurs and a discharge space in which electric plasma discharge is generated, said reaction space forming a passage for a photoreactive gas, and said electric plasma being generated for radiating ultraviolet rays which cause a photochemical reaction of said photoreactive gas;

a mercury reservoir outside said vessel and in communication with the discharge space by way of a communication pipe; and means, including a Peltier effect element, for controlling the temperature of the mercury reservoir.

* * * * *